US006211654B1

(12) United States Patent
O'Sullivan

(10) Patent No.: US 6,211,654 B1
(45) Date of Patent: Apr. 3, 2001

(54) METHOD FOR PREDICTING BATTERY CAPACITY

(75) Inventor: Thomas D. O'Sullivan, Summit, NJ (US)

(73) Assignee: Telcordia Technologies, Inc., Morristown, NJ (US)

( * ) Notice: Subject to any disclaimer, the term of this patent is extended or adjusted under 35 U.S.C. 154(b) by 0 days.

(21) Appl. No.: 09/611,162

(22) Filed: Jul. 6, 2000

(51) Int. Cl.$^7$ ........................................... H02J 7/04
(52) U.S. Cl. ............................................... 320/149
(58) Field of Search ............................... 320/149

(56) References Cited

U.S. PATENT DOCUMENTS

| | | | |
|---|---|---|---|
| 6,034,507 | * | 9/1999 | Ikawa et al. .......................... 320/149 |
| 6,127,807 | * | 9/1999 | Tsai ...................................... 320/149 |

* cited by examiner

Primary Examiner—Peter S. Wong
Assistant Examiner—Pia Tibbits
(74) Attorney, Agent, or Firm—David A. Hey

(57) ABSTRACT

The present invention provides a new and novel method of and system for predicting remaining battery capacity. The present invention is based upon the ability to predict remaining battery capacity from noting the discharge characteristics over a relatively short period of time at the beginning of full discharge. In particular, the present invention has found correlation factors which can be used in combination with discharge characteristics early in the full discharge, to predict the remaining battery capacity to a predetermined end discharge voltage. The ability to predict remaining battery capacity to a predetermined end discharge voltage can be extremely valuable in preventing battery shut down by allowing early detection of potential problems. Further, the present invention relates to a system of monitoring batteries using the method, which system can be operated a t a remote location from the batteries.

28 Claims, No Drawings

METHOD FOR PREDICTING BATTERY CAPACITY

BACKGROUND OF THE INVENTION

Batteries are used as power sources or as backup (emergency) power sources in a number of industries, including the telecommunications industry. In addition, other industries are relying more and more heavily on battery power. For example, the recent advent of true electric, battery powered vehicles has increased the interest in battery technology.

Batteries for power sources are usually provided in banks or strings, for example, a string of 24 batteries is often used for back up purposes in central offices of telecommunications providers. These backup battery power systems provide the energy to power equipment in the event of an electrical outage or failure. Therefore, maintaining the reliability of battery power systems, especially backup battery power systems is extremely important. Further, it is important to be able to predict potential power outages or failures and plan where portable engines or extra batteries may be needed.

However, a fundamental problem with battery systems is the inability to predict or estimate the available capacity without fully discharging the batteries. Therefore, there is a need for a simple, quick and cost effective method of predicting remaining battery capacity.

SUMMARY OF THE INVENTION

The present invention provides a new methods of predicting remaining battery capacity without requiring full discharge of the battery. In particular, the present invention relates to methods of determining battery capacity by measuring the discharge over a relatively short period of time and from such measurement determining the remaining battery capacity.

DESCRIPTION OF THE INVENTION

The present invention provides new and novel methods of predicting remaining battery capacity. There are actually three related methods discussed herein, the first being the simplest, but least accurate, while the second and third are somewhat more complicated but enable better accuracy and can be adapted to work for a number of different types of batteries and industries.

The first method was developed following the discovery that the life of a battery is approximately half that which is expected. In particular, this method comprises beginning discharge of the battery, allowing the initial coup de fouet voltage drop to pass, taking a first voltage reading, continuing discharge of the battery, taking a second voltage reading, determining the slope of the discharge curve between the voltage at the first and second readings, determining the total time required for discharge to a predetermined end-of-discharge voltage using the determined slope, and dividing the total time by two.

A representative calculation showing how this first method operates follows.

Discharge of a battery having 49 Vdc was carried out over 1.85 hours and a voltage change of 10.1 mV/min or 0.606 V/hr was measured. A predetermined 43 Vdc voltage cutoff was assumed. Therefore, the time for discharge from 49 Vdc to 43 Vdc was calculated as:

(49 Vdc−43 Vdc)/0.606 V/hr=9.90 hr.

To determine remaining battery capacity this calculated number was divided by two:

9.90 hr/2=4.95 hr.

As shown, the remaining capacity of the tested battery was predicted to be 4.95 hours while total discharge would require 6.75 hours (1.85 hour test plus 4.95 hour predicted remaining capacity).

This method is simple and quick, requiring little more than a volt meter to measure the voltage change over discharge time and a calculator for easy calculation. Remote access to the data could allow for centralized checking of numerous battery power plants. Using the calculated data, portable engines or extra batteries could be dispatched to potential problem areas efficiently and quickly.

The results of several experimental tests and calculations utilizing this first method according to the present invention follow.

Experimental Data 1

Standard valve regulated lead acid (VRLA) batteries were tested in accordance with the method of the present invention. The results for VRLA batteries having the lowest capacities and the highest capacities are shown in Tables 1 and 2, because if the method works in these extremes, it is clear that it will work for all others in between.

TABLE 1

VRLA Batteries - lowest capacities

| Time of Discharge (hours) | Voltage Slope (V/hour) | Estimated Discharge Time (6.38 hour actual) |
| --- | --- | --- |
| 2.0 | 0.606 | 6.80 |
| 3.5 | 0.800 | 6.63 |
| 4.5 | 0.980 | 6.49 |
| 5.5 | 1.449 | 6.34 |
| 6.0 | 2.00 | 6.33 |

TABLE 2

VRLA Batteries - highest capacities

| Time of Discharge (hours) | Voltage Slope (V/hour) | Estimated Discharge Time (7.98 hour actual) |
| --- | --- | --- |
| 2.0 | 0.518 | 7.80 |
| 3.5 | 0.654 | 7.38 |
| 4.5 | 0.714 | 7.87 |
| 5.5 | 0.980 | 7.88 |
| 6.0 | 1.298 | 7.97 |

As seen in Tables 1 and 2, the estimated discharge times which are arrived at through the method of the present invention correspond closely with the actual values, indicating the value of the present invention as a prediction methodology.

Experimental Data 2

Standard flooded lead acid batteries having 1680 AH at each of a 3, 5 and 8 hour reserve rate were tested according to the method of the present invention and also were fully discharged to determine actual capacity. Discharges of 3, 5 and 8 hours were studied because these are the most popular reserve rates utilized by central telecommunications offices. In all cases, a predetermined end discharge of 1.75 V/cell was assumed. The results are show in Tables 3 through 5.

TABLE 3

Capacity Data For Pb/CA Rectangular Cells
Three Hour Discharge Rate

| Discharge Time (hours) | Voltage slope (V/hour) | Measured Voltage (V) | Estimated Discharge Time (hours) |
|---|---|---|---|
| 0.5 | 0.026 | 1.904 | 3.46 |
| 1.0 | 0.032 | 1.889 | 3.17 |
| 1.5 | 0.044 | 1.871 | 2.88 |
| 2.0 | 0.056 | 1.845 | 2.85 |
| 2.5 | 0.079 | 1.812 | 3.89 |
| 2.75 | 0.116 | 1.793 | 2.94 |
| 3.0 | 0.339 | 1.756 | 3.01 |

TABLE 4

Capacity Data For Pb/CA Rectangular Cell
Five Hour Discharge Rate

| Discharge Time (hours) | Voltage Slope (V/hour) | Measured Voltage (V) | Estimated Discharge Time (hours) |
|---|---|---|---|
| 0.5 | 0.014 | 1.935 | 7.11 |
| 1.0 | 0.020 | 1.928 | 5.45 |
| 2.0 | 0.027 | 1.908 | 4.93 |
| 3.0 | 0.040 | 1.880 | 4.63 |
| 4.0 | 0.055 | 1.832 | 4.75 |
| 4.5 | 0.067 | 1.802 | 4.89 |
| 5.0 | 0.111 | 1.755 | 5.02 |

TABLE 5

Capacity Data For Pb/CA Rectangular Cells
Eight Hour Discharge Rate

| Discharge Time (hours) | Voltage Slope (V/hour) | Measured Voltage (V) | Estimated Discharge Time (hours) |
|---|---|---|---|
| 1.0 | 0.013 | 1.958 | 9.0 |
| 2.0 | 0.016 | 1.945 | 8.09 |
| 3.0 | 0.019 | 1.928 | 7.68 |
| 4.0 | 0.020 | 1.908 | 7.95 |
| 5.0 | 0.028 | 1.888 | 7.46 |
| 6.0 | 0.037 | 1.860 | 7.49 |
| 7.0 | 0.047 | 1.822 | 7.77 |
| 7.5 | 0.048 | 1.800 | 8.02 |

Experimental Data 3

The method of the present invention was also used to predict the capacity of pure lead cylindrical cells in a manner similar to that set forth in Experimental Data 2. 5 and 8 hour reserve rates were tested according to the method of the present invention and also were fully discharged to determine actual capacity. In all cases, a predetermined end discharge of 1.75 V/cell was assumed. The results are show in Tables 6 and 7.

TABLE 6

Capacity Data For Pure Lead Cylindrical Cells
Five Hour Discharge Rate

| Discharge Time (hours) | Voltage Slope (V/hour) | Measured Voltage (V) | Estimated Discharge Time (hours) |
|---|---|---|---|
| 1.0 | 0.020 | 1.960 | 6.25 |
| 2.0 | 0.029 | 1.940 | 5.28 |
| 3.0 | 0.037 | 1.905 | 5.09 |
| 4.0 | 0.062 | 1.860 | 4.89 |
| 4.5 | 0.115 | 1.828 | 4.84 |

TABLE 7

Capacity Data For Pure Lead Cylindrical Cells
Eight Hour Discharge Rate

| Discharge Time (hours) | Voltage Slope (V/hour) | Measured Voltage (V) | Estimated Discharge Time (hours) |
|---|---|---|---|
| 2.0 | 0.018 | 1.972 | 8.17 |
| 4.0 | 0.021 | 1.938 | 8.48 |
| 5.0 | 0.027 | 1.916 | 8.07 |
| 7.0 | 0.042 | 1.852 | 8.21 |
| 7.5 | 0.078 | 1.824 | 7.97 |

The above results again show that the method of the present invention may be used as a relatively quick and simple method for accurately predicting remaining battery capacity.

Experimental Data 4

Experiments were carried out to expand the potential usefulness of the present invention. In particular, three sets of large 1680 AH flooded batteries, having cell ages of 8 years, 14 years and 21 years were tested in accordance with the present invention. The calculations were carried out from readings taken at 1.88, 1.86, 1.84 and 1.80 volts. A predetermined end discharge of 1.75 V/cell was again assumed. The actual discharge capacity was also measured. The ratio of predicted to actual is also reported as a percentage. The results are show in Table 8.

TABLE 8

Predicted And Actual Flooded Discharge Capacities

| Voltage | Predicted Capacity (min.) | Ratio Predicted/Actual (%) |
|---|---|---|
| 8 Year Age - Actual Capacity = 190 min. | | |
| 1.88 | 221 | 116 |
| 1.86 | 207 | 109 |
| 1.83 | 207 | 109 |
| 1.80 | 192 | 101 |
| 14 Year Age - Actual Capacity = 246 min. | | |
| 1.88 | 238 | 97 |
| 1.86 | 239 | 97 |
| 1.83 | 238 | 97 |
| 1.80 | 241 | 98 |
| 21 Year Age - Actual Capacity = 228 min. | | |
| 1.88 | 217 | 95 |
| 1.86 | 216 | 95 |
| 1.83 | 219 | 96 |
| 1.80 | 221 | 97 |

Once again the results show the method of the present invention to be reasonable accurate.

Experimental Data 5

A number of VRLA batteries from different manufacturers were tested in accordance with the present invention. Random voltage measurements were taken at various times and the predicted capacity was calculated in accordance with the present invention. The predicted capacity is shown as a percentage of the actual capacity obtained to 1.75 volts. Results are shown in Table 9.

TABLE 9

Predicted And Actual VRLA Discharge Capacities.

| Battery | Time (min) | Predicted/Actual (%) | Time (min) | Predicted/Actual (%) | Actual (min) |
|---|---|---|---|---|---|
| 1 | 200 | 99 | 400 | 104 | 590 |
| 2 | 300 | 96 | 600 | 101 | 690 |
| 3 | 200 | 95 | 600 | 102 | 715 |
| 4 | 100 | 104 | 300 | 98 | 730 |
| 5 | 120 | 105 | 300 | 97 | 700 |
| 6 | 200 | 103 | 500 | 101 | 700 |
| 7 | 300 | 99 | 600 | 99 | 677 |
| 8 | 200 | 99 | 500 | 103 | 655 |
| 9 | 300 | 112 | 500 | 102 | 530 |
| 10 | 300 | 97 | 625 | 98 | 747 |
| 11 | 300 | 95 | 600 | 99 | 731 |
| 12 | 200 | 103 | 400 | 105 | 550 |
| 13 | 200 | 106 | 400 | 108 | 575 |
| 14 | 200 | 99 | 400 | 104 | 700 |
| 15 | 300 | 101 | 600 | 101 | 690 |

The applicability and usefulness of the present invention is again confirmed by the above results.

As noted above, this first method according to the present invention provides a means of predicting remaining battery capacity without requiring full discharge of the battery. This relatively simple first method requires only the measurement of discharge over a relatively short period of time and from such measurement determining the remaining battery capacity.

However, this first method also has some disadvantages. In particular, the division factor of two corresponds to a predetermined end discharge of 1.75 V/cell which is applicable to the telecommunications industry but is not necessarily useful for other industries and battery applications. Further, the first method relies on a single reading for determining the remaining battery capacity. It has been discovered that better accuracy can be achieved by using an iterative calculation based on multiple readings and comparisons to actual discharge times.

To overcome the first disadvantage noted above, the second method according to the present invention was discovered. This second method obtains more accurate capacity predictions by using different division factors which relate to different predetermined end discharge voltages. The second method according to the present invention is similar to the first method discussed above in that the method comprises beginning discharge of the battery, allowing the initial coup de fouet voltage drop to pass, taking a first voltage reading, continuing discharge of the battery, taking a second voltage reading, determining the slope of the discharge curve between the voltage at the first and second readings, and determining the total time required for discharge to a predetermined end discharge voltage using the determined slope. However, rather than divide the determined time by two as in the first method, in this second method the determined time is divided by a factor which varies depending on the predetermined end discharge voltage which is determined by the battery application and industry needs.

The division factors for use in accordance with this second method according to the present invention are set forth in Table 10.

TABLE 10

Division Factor For Use In Determining Battery Capacity.

| Predetermined End Discharge Voltage | Division Factor |
|---|---|
| 2.15 | 1.005 |
| 2.10 | 1.01 |
| 2.05 | 1.02 |
| 2.00 | 1.05 |
| 1.95 | 1.10 |
| 1.93 | 1.15 |
| 1.90 | 1.25 |
| 1.85 | 1.50 |
| 1.80 | 1.70 |
| 1.75 | 2.00 |
| 1.70 | 2.60 |
| 1.65 | 3.20 |

A representative calculation showing how this second method operates and compares with the first method discussed above follows. The equation for determining predicted discharge times can be written as:

$$[(V-V_{pd})/S(D)]+(T_2-T_1)=T_p$$

wherein V is the voltage reading, $V_{pd}$ is the predetermined discharge voltage, S is the determined slope, D is the first division factor, $T_2-T_1$ represents the time into discharge at which the voltage is read, and $T_p$ is the predicted discharge time.

A Pb/Ca battery cell was studied over a three hour rate discharge and the following readings were obtained. At the first reading point of a half hour into discharge, the voltage was 1.904 with a slope of 26 mV/hr. At a second reading point of one hour into discharge, the voltage was 1.889 with a slope of 32 mV.hr. At a third reading point of an one and a half hours into discharge, the voltage was 1.871 with a slope of 44 mV/hr.

For the telecommunications industry a predetermined end discharge voltage of 1.75 volts is standard. Therefore, in accordance with the equation noted above the total time for discharge is calculated from the first reading point as:

$$[(1.904V-1.75V)/(0.026V/hr)(2)]+(0.5\ hr-0\ hr)=3.46\ hr.$$

The total time for discharge is calculated from the second reading point as:

$$[(1.889V-1.75V)/(0.032V/hr)(2)]+(1\ hr-0\ hr)=3.17\ hr.$$

The total time for discharge is calculated from the third reading point as:

$$[(1.871V-1.75V)/(0.044V/hr)(2)]+(1.5\ hr-0\ hr)=2.88\ hr.$$

It should be noted that the same results would be obtained by using either the first or second method according to the present invention in this case since the division factor for 1.75 volts is 2, as shown in Table 10 above.

However, for other industries the predetermined end discharge voltage may be very different from that of the telecommunications industry. Therefore, different division factors would be appropriate. Using the same measured values as given above, the second method according to the present invention can be used to predict time to discharge for different predetermined end discharge voltages.

For example, time to discharge to 1.85 volts can be predicted as follows.
For the first reading point:

$$[(1.904V-1.85V)/(0.026V/hr)(1.5)]+(0.5\ hr-0\ hr)=1.88\ hr.$$

For a the second reading point:

[(1.889V−1.85V)/(0.032V/hr)(1.5)]+(1 hr−0 hr)=1.81 hr.

For the third reading point:

[(1.871V−1.85V)/(0.044V/hr)(1.5)]+(1.5 hr−0 hr)=1.82 hr.

These calculations compare favorably with an actual time to reach 1.85 volts of 1.92 hrs.

The second method which relies on different division factors for different predetermined end discharge voltages is more versatile than the first method and has broader scope of use and applicability to many industries. Like the first method, the second method is simple and quick, requiring little more than a volt meter to measure the voltage change over discharge time, a calculator for easy calculation and the appropriate division factor from Table 10 above. Remote access to the data could allow for centralized checking of numerous battery power plants at any selected end discharge voltage.

The third method according to the present invention provides a more accurate iterative prediction method derived from the first and second methods noted above. In particular, using the division factors derived for the second method and set forth in Table 10, predictions can be made to any end discharge voltage. In accordance with the third method, predictions for higher end voltages can then be compared to actual results and the comparison can be used as a correction factor for predictions to lower end voltages.

For example, if the battery or battery string being tested is performing better than expected, then the real discharge time for the early predictions would be longer than the predicted discharge time for that voltage and the time prediction for reaching the end discharge voltage would be lengthened. If the battery or battery string being tested is performing worse than expected, then the real discharge time for the early predictions would be shorter than the predicted discharge time for that voltage and the time prediction for reaching the end discharge voltage would be shortened.

As a further example, in the case where 1.75 volts is the predetermined end discharge voltage, using the division factors of Table 10 and the equation noted above for determining predicted discharge time, a prediction of the time to reach 1.95 volts could be made. This predicted value is then compared to the actual time it takes to reach 1.95 volts, which would be relatively early in the discharge. The predicted and actual values are then compared and a correction factor based on that comparison is used to correct the prediction to reach 1.75 volts. If the predicted time to reach 1.95 volts is 1.4 hours and the actual time is 1.5 hours, then the battery is performing better than expected and the correction factor for reaching 1.75 volts is 1.5/1.4=1.07 or about a seven percent increase. The equation for correcting the prediction to predetermined end discharge voltage can be written as follows:

$$T_{pe}(T_a/T_{p1})=T_{cpe}$$

wherein $T_{pe}$ is the predicted discharge time to the predetermined end discharge voltage, $T_a$ is the actual discharge time to the first predicted discharge time, $T_{p1}$ is the first predicted discharge time, and $T_{cpe}$ is the corrected predicted discharge time to the predetermined end discharge voltage.

The third method according to the present invention can be carried out for any target voltage during the discharge. For example, initial comparisons could be made for 1.95 volts, and then a new target voltage could be chosen once the battery passes the 1.95 volts level, e.g. 1.93 volts or 1.90 volts. The predetermined end discharge voltage prediction is corrected as each comparison voltage is calculated and this manor the predicted time to reach the predetermined end discharge voltage is continually updated and corrected based on the current state of discharge of the battery or battery string. The state of the battery string may vary from reading to reading, e.g. because of a load change or battery change, but this third method will detect those changes and allow the final time prediction to be adjusted accordingly. The more readings taken the greater the reliability of this third method, so that using ten target values will provide better results than if only five target values are used.

Experimental data which shows uses third method according to the present invention is provided below.

Experimental Data 6

A Pb/Ca battery cell was studied over a three hour rate discharge in a manner similar to that described above with respect to the second method according to the present invention. A first reading point of a half hour into discharge, provided a voltage of 1.904 with a slope of 26 mV/hr. The highest available target voltage from Table 10 which is still below the voltage reading is 1.90 volts which has a division factor of 1.25. The predicted total time to reach 1.90 volts is therefore calculated as:

[(1.904V−1.90V)/(0.026V/hr)(1.25)]+(0.5 hr−0 hr)=0.623 hr.

The actual time to reach 1.90 volts was 0.67 hr, showing that the battery is performing better than expected.

The predicted total time to reach the predetermined end discharge voltage of 1.75 volts having a division factor of 2 is calculated from the first reading point as:

[(1.904V−1.75V)/(0.026V/hr)(2)]+(0.5 hr−0 hr)=3.46 hr.

The actual time to reach 1.90 volts was found to be 0.67 hr. Therefore, the predicted time to reach 1.75 volts is corrected using the comparison between the predicted and actual times to reach 1.90 volts as:

3.46 hr(0.67 hr/0.623 hr)=3.72 hr.

Table II below shows the above and further results based on further reading points. Column A shows the time at which reading points where measured. Columns B and C show the voltage and slope read at the reading point time of Column A. Columns D and E show the highest available target voltage and associated division factor for the measured voltage of Column B. Columns F and G show the predicted time and the actual time to reach the target voltage of Column D. Column H shows the predicted time to reach the predetermined end discharge voltage of 1.75 volts. Column I shows the corrected predicted time to reach the predetermined end discharge voltage of 1.75 volts calculated by using the comparison of predicted and actual times to reach the target voltage.

TABLE 11

Predicted And Actual Voltage Values

| A (hr) | B (V) | C (mV/hr) | D (V) | E | F (hr) | G (hr) | H (hr) | I (hr) |
|---|---|---|---|---|---|---|---|---|
| 0.5 | 1.904 | 26 | 1.90 | 1.25 | 0.623 | 0.67 | 3.46 | 3.72 |
| 1.0 | 1.889 | 32 | 1.85 | 1.5 | 1.813 | 1.92 | 3.17 | 3.36 |
| 1.5 | 1.871 | 44 | 1.85 | 1.5 | 1.818 | 1.92 | 2.88 | 3.04 |

TABLE 11-continued

Predicted And Actual Voltage Values

| A (hr) | B (V) | C (mV/hr) | D (V) | E | F (hr) | G (hr) | H (hr) | I (hr) |
|---|---|---|---|---|---|---|---|---|
| 2.0 | 1.845 | 52 | 1.80 | 1.7 | 2.509 | 2.65 | 2.91 | 3.08 |
| 2.5 | 1.812 | 79 | 1.80 | 1.7 | 2.589 | 2.65 | 2.89 | 2.96 |

The actual time to discharge to 1.75 volts was 3.04 hr. Therefore, it can be seen from Table 11 that the first two calculations using the third method of the present invention resulted in predicting lengthened predicted time to reach the predetermined end discharge voltage of 1.75 volts, which were less accurate than the predicted values which result from using the second method according to the present invention. However, in the last three calculations, accuracy was improved by using the third method according to the present invention.

Experimental Data 7

A further experiment was carried out for a conventional Pb/Ca battery as set forth below in Table 12.

In Table 12, Column A shows the time at which reading points where measured. Columns B and C show the voltage and slope read at the reading point time of Column A. Columns D and E show the highest available target voltage and associated division factor for the measured voltage of Column B. Columns F and G show the predicted time and the actual time to reach the target voltage of Column D. Column H shows the predicted time to reach the predetermined end discharge voltage of 1.75 volts. Column I shows the corrected predicted time to reach the predetermined end discharge voltage of 1.75 volts calculated by using the comparison of predicted and actual times to reach the target voltage.

TABLE 12

Predicted And Actual Voltage Values

| A (hr) | B (V) | C (mV/hr) | D (V) | E | F (hr) | G (hr) | H (hr) | I (hr) |
|---|---|---|---|---|---|---|---|---|
| 0.5 | 1.935 | 14 | 1.93 | 1.15 | 0.811 | 0.87 | 7.11 | 7.62 |
| 1.0 | 1.928 | 15 | 1.90 | 1.25 | 2.493 | 2.33 | 6.93 | 6.48 |
| 2.0 | 1.908 | 27 | 1.90 | 1.25 | 2.237 | 2.33 | 4.93 | 5.13 |
| 3.0 | 1.880 | 40 | 1.85 | 1.5 | 3.500 | 3.67 | 4.63 | 4.85 |
| 4.0 | 1.832 | 55 | 1.80 | 1.7 | 4.342 | 4.50 | 4.75 | 4.92 |
| 4.5 | 1.802 | 67 | 1.80 | 1.7 | 4.518 | 4.50 | 4.89 | 4.87 |

The actual time to discharge to 1.75 volts was 5.05 hr. Therefore, from Table 12 it is found that except for the first calculation, using the third method of the present invention resulted in a more accurate prediction of the time to reach the predetermined end discharge voltage of 1.75 volts, than that which would result from using the second method according to the present invention. The last calculation is only marginally less accurate using the third method and the values are so close as to be inconsequential to any analysis.

Experimental Data 8

An experiment was also carried out for a pure lead round cell battery as set f orth below in Table 13.

In Table 13, Column A shows the time at which reading points where measured. Columns B and C show the voltage and slope read at the reading point time of Column A. Columns D and E show the highest available target voltage and associated division factor for the measured voltage of Column B. Columns F and G show the predicted time and the actual time to reach the target voltage of Column D. Column H shows the predicted time to reach the predetermined end discharge voltage of 1.75 volts. Column I shows the corrected predicted time to reach the predetermined end discharge voltage of 1.75 volts calculated by usin1g the comparison of predicted and actual times to reach the target voltage.

TABLE 13

Predicted And Actual Voltage Values

| A (hr) | B (V) | C (mV/hr) | D (V) | E | F (hr) | G (hr) | H (hr) | I (hr) |
|---|---|---|---|---|---|---|---|---|
| 1.0 | 1.96 | 20 | 1.95 | 1.10 | 1.455 | 1.53 | 6.25 | 6.57 |
| 2.0 | 1.94 | 29 | 1.93 | 1.15 | 2.299 | 2.33 | 5.28 | 5.34 |
| 3.0 | 1.905 | 37 | 1.90 | 1.25 | 3.108 | 3.13 | 5.09 | 5.13 |
| 4.0 | 1.860 | 62 | 1.85 | 1.5 | 4.108 | 4.20 | 4.89 | 4.99 |
| 4.5 | 1.828 | 115 | 1.80 | 1.7 | 4.643 | 4.83 | 4.84 | 5.03 |

The actual time to discharge to 1.75 volts was 5.23 hr. The first and second calculations from Table 13 using the third method of the present invention resulted in a less accurate prediction of the time to reach the predetermined end discharge voltage of 1.75 volts, than that which results from using the second method according to the present invention. However, the last three calculations are all more accurate using the third method according to the present invention.

The methods according to the present invention provide simple and quick ways of predicting remaining battery capacity. Remote access to the data makes the methods according to the present invention even more useful. While the experimental data above is primarily focused on the telecommunications industry uses of batteries, it will be clear to one skilled in the art how the methods according to the present invention could be used in other industries. The calculations are the same, the results vary only in accordance with the predetermined end discharge voltage chosen. Also from the experimental data, it has been shown that the methods of the present invention are useful for different types of batteries which have different plateau voltages and different slopes.

The results obtained by any of the methods according to the present invention as described herein are satisfactory. However, the first and second methods provide only one value related to a predetermined end discharge voltage, while the third method provides greater confidence to the user because the intermediate determinations are verifiable and provide an indication as to how well the method is working an It is anticipated that other embodiments and variations of the present invention will become apparent to t h e skilled artisan in the light of the foregoing specification. Such embodiments and variations are intended to likewise be included within the scope of the invention as set out in the appended claims.

What is claimed is:

1. A method of predicting remaining battery discharge time comprising:
   beginning discharge of the battery;
   taking a first voltage reading at a first time;
   taking a second voltage reading at a second time later than said first time;
   determining the slope of the discharge curve between said first voltage reading and said second voltage reading;
   determining a first predicted discharge time to a first predetermined discharge voltage using said determined slope and a first division factor for said first predetermined discharge voltage;

determining a final predicted discharge time to a final predetermined discharge voltage using said determined slope and a final division factor for said final predetermined discharge voltage;

taking an actual discharge time reading when said battery reaches said first predetermined discharge voltage; and correcting said final predicted discharge time using a ratio of said actual discharge time reading to said first predicted discharge time.

2. A method according to claim 1, wherein said step of determining said first predicted discharge time comprises:

calculating said first predicted discharge time using the formula $$[(V_2-V_{pd1})/S(D_1)]+(T_2-T_1)=T_{p1}$$

wherein $V_2$ is said second voltage reading,
$V_{pd1}$ is said first predetermined discharge voltage,
S is said determined slope,
$D_1$ is said first division factor,
$T_2$ is said second time,
$T_1$ is said first time, and
$T_{p1}$ is said first predicted discharge time.

3. A method according to claim 1, wherein said step of determining said final predicted discharge time comprises:

calculating said final predicted discharge time using the formula $$[(V_2-V_{pdf})/S(D_f)]+(T_2-T_1)=T_{pf}$$

wherein $V_2$ is said second voltage reading,
$V_{pdf}$ is said final predetermined discharge voltage,
S is said determined slope,
$D_f$ is said final division factor,
$T_2$ is said second time,
$T_1$ is said first time, and
$T_{pf}$ is said final predicted discharge time.

4. A method according to claim 1, wherein said first division factor and said final division factor are selected from the following table:

| Predetermined Discharge Voltage | Division Factor |
|---|---|
| 2.15 | 1.005 |
| 2.10 | 1.01 |
| 2.05 | 1.02 |
| 2.00 | 1.05 |
| 1.95 | 1.10 |
| 1.93 | 1.15 |
| 1.90 | 1.25 |
| 1.85 | 1.50 |
| 1.80 | 1.70 |
| 1.75 | 2.00 |
| 1.70 | 2.60 |
| 1.65 | 3.20 |

5. A method according to claim 1, wherein said step of correcting said final predicted discharge time comprises:

calculating a corrected final predicted discharge time using the formula $$T_{pf}(T_{a1}/T_{p1})=T_{cpf}$$

wherein $T_{pf}$ is said final predicted discharge time,
$T_{a1}$ is said actual discharge time,
$T_{p1}$ is said first predicted discharge time, and
$T_{cpf}$ is said corrected final predicted discharge time.

6. A method according to claim 1, wherein all of the steps of the method are performed iteratively until said final predetermined discharge voltage is reached by said battery.

7. A method according to claim 6, wherein all said steps of said method are performed at least two times.

8. A method according to claim 6, wherein all said steps of said method are performed at least five times.

9. A method according to claim 6, wherein all said steps of said method are performed at least ten times.

10. A method of predicting remaining battery discharge time comprising:

beginning discharge of the battery;

taking a first voltage reading at a first time;

taking a second voltage reading at a second time later than said first time;

determining the slope of the discharge curve between said first voltage reading and said second voltage reading;

determining a predicted discharge time to a predetermined discharge voltage using said determined slope and a division factor for said predetermined discharge voltage.

11. A method according to claim 10, wherein said step of determining said predicted discharge time comprises:

calculating said predicted discharge time using the formula $$[(V_2-V_{pd})/S(D)]+(T_2-T_1)=T_p$$

wherein $V_2$ is said second voltage reading,
$V_{pd}$ is said predetermined discharge voltage,
S is said determined slope,
D is said division factor,
$T_2$ is said second time,
$T_1$ is said first time, and
$T_p$ is said predicted discharge time.

12. A method according to claim 10, wherein said division factor is selected from the following table:

| Predetermined Discharge Voltage | Division Factor |
|---|---|
| 2.15 | 1.005 |
| 2.10 | 1.01 |
| 2.05 | 1.02 |
| 2.00 | 1.05 |
| 1.95 | 1.10 |
| 1.93 | 1.15 |
| 1.90 | 1.25 |
| 1.85 | 1.50 |
| 1.80 | 1.70 |
| 1.75 | 2.00 |
| 1.70 | 2.60 |
| 1.65 | 3.20 |

13. A system for the prediction of remaining battery discharge time comprising:

means for obtaining voltage readings at various times during discharge of said battery; and means for calculating a predicted discharge time to a predetermined discharge voltage.

14. A system according to claim 13, wherein said means for obtaining voltage readings comprises a volt meter.

15. A system according to claim 13, wherein said system is in a location remote from said battery for which the prediction of remaining battery discharge time is being performed.

16. A system according to claim 13, wherein said means for obtaining voltage readings comprises:
   means for taking a first voltage reading at a first time; and
   means for taking a second voltage reading at a second time later than said first time.

17. A system according to claim 16, wherein said means for calculating a predicted discharge time comprises:
   means for determining the slope of the discharge curve between said first voltage reading and said second voltage reading;
   means for determining said predicted discharge time from said determined slope and a division factor for said predetermined discharge voltage.

18. A system according to claim 17, wherein said means for determining said predicted discharge time comprises:
   means for calculating said predicted discharge time using the formula $$[(V_2-V_{pd})/S(D)]+(T_2-T_1)=T_p$$

wherein
   $V_2$ is said second voltage reading,
   $V_{pd}$ is said predetermined discharge voltage,
   S is said determined slope,
   D is said division factor,
   $T_2$ is said second time,
   $T_1$ is said first time, and
   $T_p$ is said predicted discharge time.

19. A system according to claim 17, wherein said division factor is selected from the following table:

| Predetermined Discharge Voltage | Division Factor |
| --- | --- |
| 2.15 | 1.005 |
| 2.10 | 1.01 |
| 2.05 | 1.02 |
| 2.00 | 1.05 |
| 1.95 | 1.10 |
| 1.93 | 1.15 |
| 1.90 | 1.25 |
| 1.85 | 1.50 |
| 1.80 | 1.70 |
| 1.75 | 2.00 |
| 1.70 | 2.60 |
| 1.65 | 3.20 |

20. A system according to claim 16, wherein said means for calculating a predicted discharge time comprises:
   means for determining the slope of the discharge curve between said first voltage reading and said second voltage reading;
   means for determining a first predicted discharge time to a first predetermined discharge voltage using said determined slope and a first division factor for said first predetermined discharge voltage;
   means for determining a final predicted discharge time to a final predetermined discharge voltage using said determined slope and a final division factor for said final predetermined discharge voltage;
   means for taking an actual discharge time reading when said battery reaches said first predetermined discharge voltage; and
   means for correcting said final predicted discharge time using a ratio of said actual discharge time reading to said first predicted discharge time.

21. A system according to claim 20, wherein said means for determining a first predicted discharge time comprises:
   means for calculating said first predicted discharge time using the formula $$[(V_2-V_{pd1})/S(D_1)]+(T_2-T_1)=T_{p1}$$

wherein
   $V_2$ is said second voltage reading,
   $V_{pd1}$ is said first predetermined discharge voltage,
   S is said determined slope,
   $D_1$ is said first division factor,
   $T_2$ is said second time,
   $T_1$ is said first time, and
   $T_{p1}$ is said first predicted discharge time.

22. A system according to claim 20, wherein said means for determining said final predicted discharge time comprises:
   means for calculating said final predicted discharge time using the formula $$[(V_2-V_{pdf})/S(D_f)]+(T_2-T_1)=T_{pf}$$

wherein
   $V_2$ is said second voltage reading,
   $V_{pdf}$ is said final predetermined discharge voltage,
   S is said determined slope,
   $D_f$ is said final division factor,
   $T_2$ is said second time,
   $T_1$ is said first time, and
   $T_{pf}$ is said final predicted discharge time.

23. A system according to claim 20, wherein said first division factor and said final division factor are selected from the following table:

| Predetermined Discharge Voltage | Division Factor |
| --- | --- |
| 2.15 | 1.005 |
| 2.10 | 1.01 |
| 2.05 | 1.02 |
| 2.00 | 1.05 |
| 1.95 | 1.10 |
| 1.93 | 1.15 |
| 1.90 | 1.25 |
| 1.85 | 1.50 |
| 1.80 | 1.70 |
| 1.75 | 2.00 |
| 1.70 | 2.60 |
| 1.65 | 3.20 |

24. A system according to claim 20, wherein said means for correcting said final predicted discharge time comprises:
   means for calculating a corrected final predicted discharge time using the formula $$T_{pf}(T_{a1}/T_{p1})=T_{pf}$$

wherein
   $T_{pf}$ is said final predicted discharge time,
   $T_{a1}$ is said actual discharge time,
   $T_{p1}$ is said first predicted discharge time, and
   $T_{cpf}$ is said corrected final predicted discharge time.

25. A system according to claim 20, wherein all of said means are used iteratively until said final predetermined discharge voltage is reached by said battery.

26. A system according to claim 25, wherein all of said means are used at least two times.

27. A system according to claim 25, wherein all said means are used at least five times.

28. A system according to claim 25, wherein all said means are used at least ten times.

* * * * *